(12) United States Patent
Asanza Maldonado

(10) Patent No.: US 10,707,654 B2
(45) Date of Patent: Jul. 7, 2020

(54) POWER DISTRIBUTOR

(71) Applicant: ELLENBERGER & POENSGEN GMBH, Altdorf (DE)

(72) Inventor: Diego Fernando Asanza Maldonado, Nuremberg (DE)

(73) Assignee: Ellenberger & Poensgen GmbH, Altdorf (DE)

( * ) Notice: Subject to any disclaimer, the term of this patent is extended or adjusted under 35 U.S.C. 154(b) by 180 days.

(21) Appl. No.: 15/972,751

(22) Filed: May 7, 2018

(65) Prior Publication Data

US 2018/0254615 A1 Sep. 6, 2018

Related U.S. Application Data

(63) Continuation of application No. PCT/EP2016/068462, filed on Aug. 2, 2016.

(30) Foreign Application Priority Data

Nov. 6, 2015 (DE) ................. 10 2015 221 899

(51) Int. Cl.
*H01H 71/02* (2006.01)
*H02B 1/052* (2006.01)
(Continued)

(52) U.S. Cl.
CPC ......... *H02B 1/052* (2013.01); *G05B 19/0421* (2013.01); *G05B 19/0425* (2013.01);
(Continued)

(58) Field of Classification Search
CPC ............ G05B 19/0421; G05B 19/0425; G05B 2219/21008; G05B 2219/21028;
(Continued)

(56) References Cited

U.S. PATENT DOCUMENTS 5,831,546 A 11/1998 Costa et al.
7,414,828 B2 8/2008 Birner
(Continued)

FOREIGN PATENT DOCUMENTS

DE 202004008141 U1 10/2005
DE 202014009245 U1 2/2016
(Continued)

OTHER PUBLICATIONS

IPER for International Application No. PCT/EP2016/068462 dated May 8, 2018.
(Continued)

*Primary Examiner* — Michael J Brown
(74) *Attorney, Agent, or Firm* — Muncy, Geissler, Olds & Lowe, P.C.

(57) ABSTRACT

A power distributor having a first controller and having a number of connection modules which are connected thereto and are intended to be mounted on a supporting rail. The connection module has a number of lateral coupling contacts for the electrical and/or signalling contact connection to at least one further connection module which is attached or can be attached to the particular connection module, wherein a base resistor is connected in each case between two coupling contacts inside the module in such a manner that the base resistors of the attached connection modules form a resistor chain which is connected in series. The connection modules are each equipped or can be equipped with an actuatable circuit breaker. The circuit breakers have a second controller inside the circuit breaker for recording a voltage dropped across the respectively associated base resistor.

10 Claims, 7 Drawing Sheets

(51) Int. Cl.
  *H02B 1/056* (2006.01)
  *H02B 1/20* (2006.01)
  *G05B 19/042* (2006.01)
  *H02J 13/00* (2006.01)
  *G05B 19/04* (2006.01)

(52) U.S. Cl.
  CPC ............. *H02B 1/056* (2013.01); *H02B 1/205* (2013.01); *H02J 13/00012* (2020.01); *G05B 2219/21008* (2013.01); *G05B 2219/21028* (2013.01); *G05B 2219/25117* (2013.01); *H01H 71/02* (2013.01)

(58) Field of Classification Search
  CPC .......... G05B 2219/25117; H02B 1/052; H02B 1/056; H02B 1/205; H01H 71/02; H02J 13/00012
  USPC ........................................................ 700/297
  See application file for complete search history.

(56) References Cited

U.S. PATENT DOCUMENTS

| | | |
|---|---|---|
| 9,876,334 B2 | 1/2018 | Burke et al. |
| 9,899,807 B2 | 2/2018 | Roth |
| 2009/0021879 A1* | 1/2009 | Rivers, Jr. .............. H02H 3/006 361/93.2 |
| 2013/0045613 A1 | 2/2013 | Griese et al. |
| 2015/0288184 A1* | 10/2015 | Kalhoff ................... H04L 12/10 307/12 |

FOREIGN PATENT DOCUMENTS

| | | |
|---|---|---|
| EP | 0806751 A1 | 11/1997 |
| EP | 2154831 A1 | 2/2010 |
| JP | 2013526758 A | 6/2013 |
| JP | 2015089232 A | 5/2015 |
| WO | WO2015062731 A1 | 5/2015 |
| WO | WO2015103196 A1 | 7/2015 |

OTHER PUBLICATIONS

International Search Report dated Oct. 20, 2016 in corresponding application PCT/EP2016/068462.
Japanese Office Action dated Sep. 17, 2019 in corresponding application 2018-519919.

* cited by examiner

POWER DISTRIBUTOR

This nonprovisional application is a continuation of International Application No. PCT/EP2016/068462, which was filed on Aug. 2, 2016, and which claims priority to German Patent Application No. 10 2015 221 899.6, which was filed in Germany on Nov. 6, 2015, and which are both herein incorporated by reference.

BACKGROUND OF THE INVENTION

Field of the Invention

The present invention relates to a modular power distributor intended for direct mounting on a supporting rail, comprising a number of power distribution modules, in particular in the form of modular devices. The invention further relates to a method for operating such a power distributor.

Description of the Background Art

A power distributor can be understood as an electrical installation having one or more electric load circuits to which a current is supplied from a main line. In the context of the power distributor, safety mechanisms are provided which secure each load circuit against overload or a short circuit.

The safety mechanisms are in particular mechanical, electronic or mechatronic circuit breakers, which are connected between a main circuit or a supply and the load circuits. The circuit breakers are often single-wired by flexible wires to the power supply and load. Thus, the assembly of such a power distributor is particularly labor intensive. Furthermore, the switching system formed by such a power distributor is relatively hard to navigate due to the single wiring, which makes repair and subsequent changes in the assembled state of the power distributor disadvantageous.

To reduce the wiring costs of conventional power distributors, so-called modular power distributors can be used. Such power distributors are composed of a plurality of individual power distribution modules which are electrically conductive and can be coupled with each other. The power distribution modules are typically mounted directly side by side as modular devices on a supporting rail (DIN rail) and have on the one hand supply terminals for feed-in and for the load and on the other hand, at least one socket-like slot for the interposition of a circuit breaker. The lined-up modules are typically electrically conductively coupled in a visually clear manner by means of a conductor rail, which bridges a plurality of modules.

In the context of such a power distributor, such power distribution modules equipped with breakers are in particular provided at the junctions where the load circuits branch off from the main power line. The circuit breakers are used here if needed to separate the respective, associated load circuit from the live main power line.

Typically, wirings for signaling are provided by a series of individual power distribution modules. The circuit breakers used for this purpose have integrated signal contacts (NO and NC), which, depending on whether they are applied in the context of a single or group signaling, can be wired and actuated by a switching signal.

When using serial communication and signaling methods, a so-called daisy-chain arrangement may be formed by wiring the power distribution modules. In this case, in terms of use it is desirable in a bus functionality that each circuit breaker or each power distribution module is assigned a separate signal or device address, so that each circuit breaker as part of a signal bus can be individually addressed, or in particular controlled. Particularly with regard to the modular design of the power distributor, it may further be desirable that the address allocation also takes into account empty slots in the modules, so that when a circuit breaker is inserted subsequently, no new address must be assigned.

In case of failure, that is, particularly in a galvanic interruption of the daisy-chain arrangement, it is particularly desirable to locate the defective circuit breaker and/or the defective power distribution module or the point of interruption in the series connection as quickly as possible.

SUMMARY OF THE INVENTION

It is therefore an object of the present invention to provide a power distributor which is particularly suitable in terms of a communication and/or signaling application. Furthermore, a method for operating such a power distributor is to be provided.

A power distributor according to an exemplary embodiment of the invention is designed to be modular with a number of attached or attachable connection modules—hereinafter shortened to modules. The individual modules and thus the power distributor are adapted and arranged for direct mounting on a supporting rail, such as a DIN or G-rail. For this purpose, the modules can be mounted on the supporting rail, in particular in the manner of modular devices in a row next to each other. The module package thus formed is connected to a common first controller (that is, to a common first control device).

The modules each can have a number of lateral coupling contacts for an electrical and/or signaling contact connection with at least one further module attached or attachable to the side of the respective module. Inside the module, in each case one base resistor is connected such between two contacts, that the base resistors of the lined-up modules form a series-connected resistor chain in the interconnection of the module package.

The modules can be used in particular for power distribution or for branching a load circuit, which is coupled by means of a supply line, and are each equipped with or can be equipped with an actuatable circuit breaker. The circuit breaker interrupts the respectively connected load circuit automatically in the event of an overload or short-circuit.

The circuit breakers each can have a breaker-internal second controller (that is, a second control unit), which—in particular in addition to other functions—serves at least also for recording a drop in voltage at the respectively associated base resistor. On the basis of the recorded voltage, the second controllers transmit a controller signal to the first controller, wherein said first controller includes a DC power source to supply and energize the resistor chain.

Thus, a power distributor is provided which is particularly suitable in terms of a communication and/or signaling application. By means of the resistor chain, the modules are serially connected to the first controller in the manner of a daisy-chain arrangement. Due to the module-internal resistor chain, the contact link is not interrupted even in a module that is not equipped with a circuit breaker. Furthermore, the contact connection between the modules results in a power distributor with particularly low wiring and circuitry costs.

The modules each comprise a, for example, flat (module) housing made of an electrically insulating material. The modules are advantageously coupled in a preferred mounting position with a main power supply or a feed for power distribution or branching.

Each module housing can have a socket-like slot on the housing front side, i.e. on the side facing away from the supporting rail, for plugging the circuit breaker. By means of the circuit breaker, the connected load circuit can be galvanically interrupted or separated. The plug connection between the module and the circuit breaker is made, for example, via multilam plugs, pin plugs, or preferably flat plugs.

The modular design of the power distributor allows for a high degree of prefabrication and thereby comparatively low manufacturing and assembly costs. In particular, it is possible to particularly easily adapt a power distributor by means of a series of a corresponding number of modules to a desired number of load circuits that are to be connected. Thus, the power distributor can be particularly flexibly used in an electrical system.

The circuit breaker is typically designed as a mechanical, electronic or mechatronic switch or a relay, and typically has a supply terminal through which a network-side, and thus current-carrying, power cable is connected by a first plug contact with the module, and a load connection, via which the load-side, outgoing power line is connected by a second plug contact with the module.

The circuit breakers are attached or can be fitted to the power distributor in the grid dimension predetermined by the modules. The modules are in particular approximately as wide as a circuit breaker, that is, a module preferably serves for receiving a respective circuit breaker. Preferably, it is hereby possible to operate the equipped circuit breaker of the power distributor both in a series circuit and in a parallel circuit, wherein optional additional connections are provided on the modules for this purpose.

As part of their design as modular devices, the modules can have a profiled slot (snap-in groove) on the rear of the housing for mounting the module package to the supporting rail. In the intended mounting position of the modules, the housing front side faces a user. The profile direction of the housing (and of the rail corresponding thereto) defines a row direction along which a plurality of modules can be aligned as intended next to one another in the assembled state. The housing sides oriented perpendicular to this row direction are hereinafter referred to as (housing) end faces.

The first controller can be adapted and configured as an external control unit for the purposes of a higher-level control device, a remotely controlled actuation of the circuit breakers and/or a recording of measured values as well as diagnosis in case of failure. In the scope of the invention it is also conceivably advantageous, for example, that the first controller is attached to the connection modules as a control module which is part of the module package.

The second controller of the circuit breaker is furthermore particularly suitable for actuating the circuit breaker in response to a switching signal of the first controller. For this purpose, the circuit breaker preferably has two signal contacts (NC, NO) for connection to the module that are interconnected with the second controller. Furthermore, the circuit breaker comprises at least one communication contact for connection to a communication line, in particular as part of a bus connection for signal contact functions.

In an embodiment, a communication line formed by the coupling contacts is provided for guiding the controller signals. The communication line is thus a substantially module-internal wiring of the modules or of the second controllers of the circuit breakers equipped therewith, for the purposes of signaling and/or actuating the circuit breaker with the first controller. By means of the coupling contacts, a cross wiring of the modules to each other is provided, wherein in the assembled state, the coupling contacts realize an electrically conductive connection in the row direction, that is, from housing end face to housing end face, between any two adjacent modules.

The communication line is also used for guiding a data bus signal (for example, the switching signal) from the first controller to one or more second controllers, wherein the resistor chain in particular serves as a second communication line for guiding an address bus signal. This makes it possible, for example, to switch the circuit breakers of different load circuits remotely, to reset them, to monitor them or to parameterize them. Parameterization in this context is understood to be the setting of, for example, tripping limits and control or operating parameters, such as the rated current of the relevant circuit breaker. For this purpose, the data bus signals are transmitted from the first controller to the second controller of the respective circuit breaker, which is adapted and configured to process and implement such signals.

In an embodiment, the connection module can have a contact opening with a split plug base contact, into which a plug contact of the circuit breaker can be inserted.

The base resistor can be connected between the thus formed partial plug base contacts. The plug contact preferably designed as a flat plug hereby expediently has a split plug tab as partial plug contacts. Thereby, the respective second controller can be connected in a structurally simple and cost effective way for recording the voltage dropped across the base resistor.

The connection module can have a ground connection, which is contacted or can be contacted on the one hand to the respective second controller and on the other hand, to a partial plug contact of the plug contact. A switching element actuatable by the second controller is connected between the ground connection and the partial plug contact. The switching element is preferably integrated in the respective circuit breaker and is designed, for example, as a transistor. By operating the switching element, it is thus possible to switch the resistor chain to ground or reference potential on the (row) position of the partial plug contacts.

In the inventive method for operating the power distributor, the first controller determines a total resistance value of the resistor chain. Using this total value, subsequently a number value corresponding to the number of connected modules is determined by the first controller. For this purpose, the resistor chain is conveniently connected at one end to the DC power source of the first controller, and at the other end to ground (reference potential). This way, the same electric current flows through all the base resistors so that the number of the connected modules is directly determined from the known resistance values of the base resistors and of the total resistance value. The total resistance value is determined in a simple manner by the output voltage of the DC power source.

Module-specific device addresses can be sent to the connected second controllers in response to the controller signals of the connected second controllers. The second controllers record the falling voltage at the respective base resistor by means of the partial plug contacts. The recorded voltage value is sent as a controller signal to the first controller. The device address is determined, for example, as an integer (rounded) quotient of the voltage value and the voltage drop of a single base resistor. This way, each second controller receives a (physical) device address which decreases along the resistor chain, starting from the DC power source. The device addresses are therefore not assigned based on the number of connected circuit breakers, but instead based on the number of connected modules or connected base resistors.

In other words, with N connected modules, the first device address is assigned to the second controller in module N (i.e., with respect to the DC power source, at the end of the resistor chain, opposite the DC power source), the second device address is associated with the second controller in the module N−1, and so forth, wherein the second controller in the first module (i.e., the module on the first base resistor of the resistor chain) is the N-th address. This way, simple addressing of the second controller is made possible. In particular, it also makes it possible in view of empty module plug slots to allocate addresses, so that if a module is subsequently equipped with a circuit breaker, no new address needs to be assigned and the second controllers continue to operate with the already assigned device addresses.

During addressing, the first controller drives a current (addressing current) as an address bus signal through the resistor chain of the module package by means of the direct current source. In a suitable embodiment, the base resistors, for example, each have a resistance value of 1 kΩ, so that with a generated addressing current of 1 mA, a voltage of 1V is dropped at each base resistor. The respective voltage value of the module is in this case suitably measured by the respective second controller, on the base resistor side facing the DC power source side.

During addressing, the second controller primarily connected downstream of the common first controller records the highest voltage value and transmits it as a controller signal to the first controller via the communication line. The subsequent circuit breaker in the series arrangement, or the second controller thereof, thus records a voltage value decreased by 1 V and reports it to the first controller. In this manner, a voltage value and a device address therefrom are assigned to each connected controller.

The module-specific device addresses of the second controller can be converted as a function of the number value into a set of logical addresses which correspond to the row order of the lined-up connection modules. This way, the sequence of the N device addresses is effectively reversed so that the first logical address is assigned to the second controller in the first module behind the DC power source, the second logical address is assigned to the second controller in the next module, etc. Thus, the user is ensured a particularly intuitive operation of the power distributor.

In a galvanic interruption of the resistor chain, a search process is initiated or triggered to determine the position of the interruption. Due to the interruption, the DC power source is no longer connected to ground (reference potential) via the resistor chain (i.e., separated therefrom) so that no address current flows through the resistor chain. On the one hand, the first controller is arranged in a simple manner to record such an interruption by detecting the address current. Furthermore, the connected second controllers record only a voltage drop of 0 V at all positions, so that an interruption is additionally or alternatively signaled by the controller signals to the first controller.

This way, wire breaks or defective components in the module package are detected easily and reliably. The determined position is then advantageously made available to or signaled to a user. This simplifies maintenance or repair of the power distributor. In order to ensure a successful search process, preferably all modules of the module package are provided with a respective circuit breaker for this application.

At the beginning of the search process, all connected second controllers are set to an ON state in which the respective switching element is closed. Thereby, the base resistors provided with a circuit breaker are in particular connected to the respective ground connection of the module. As a result, all the base resistors are connected to ground on the side facing away from the DC power source, and the address current flows from the DC power source to ground.

New addressing is started during the search process. For this purpose, the number value for the number of the connected modules is determined by the first controller, and device addresses are distributed to the respective second controllers. The second controller with the first device address is then switched off. In a preferred embodiment, the search process is terminated when there is no second controller with the first device address. This way, the first controller is able to determine the point of interruption within the module package.

After all the switching elements of the circuit breakers have been set to the ON state at the beginning of the search process, and the respective side of the base resistor is connected to ground, a voltage (of, for example, again 1 V) drops at all base resistors located between the DC power source and the point of interruption. If the interruption is downstream of the first module or downstream of the first base resistor, the second controller associated with the first module notifies the first device address. Then the switching element of said second controller is turned off, that is, the base resistor is disconnected from the ground connection. As a result, the second controller connected next in the series reports via its base resistor. Then, the switching element thereof is also turned off. This (search) process is continued until no second controller with the first device address reports. Thereby, the point of interruption between the final detected second controller, and the module connected thereto and not detected, is determined by the first controller.

The first controller and the second controllers of the power distributor according to the invention are in this case generally configured—programmatically and/or in terms of circuit technology—for performing the inventive method described above.

The controllers are essentially each formed at least by a microcontroller having a processor and a data memory in which the functionality for performing the method according to the invention in terms of an operating software (firmware) is programmatically implemented, so that the method—possibly in interaction with a user—is performed automatically upon implementing the operating software in the microcontroller.

Alternatively the first controller and/or the second controllers can be however formed by programmable electronic components, for example, an application-specific integrated circuit (ASIC) in which the functionality for performing the method according to the invention is implemented with circuitry.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
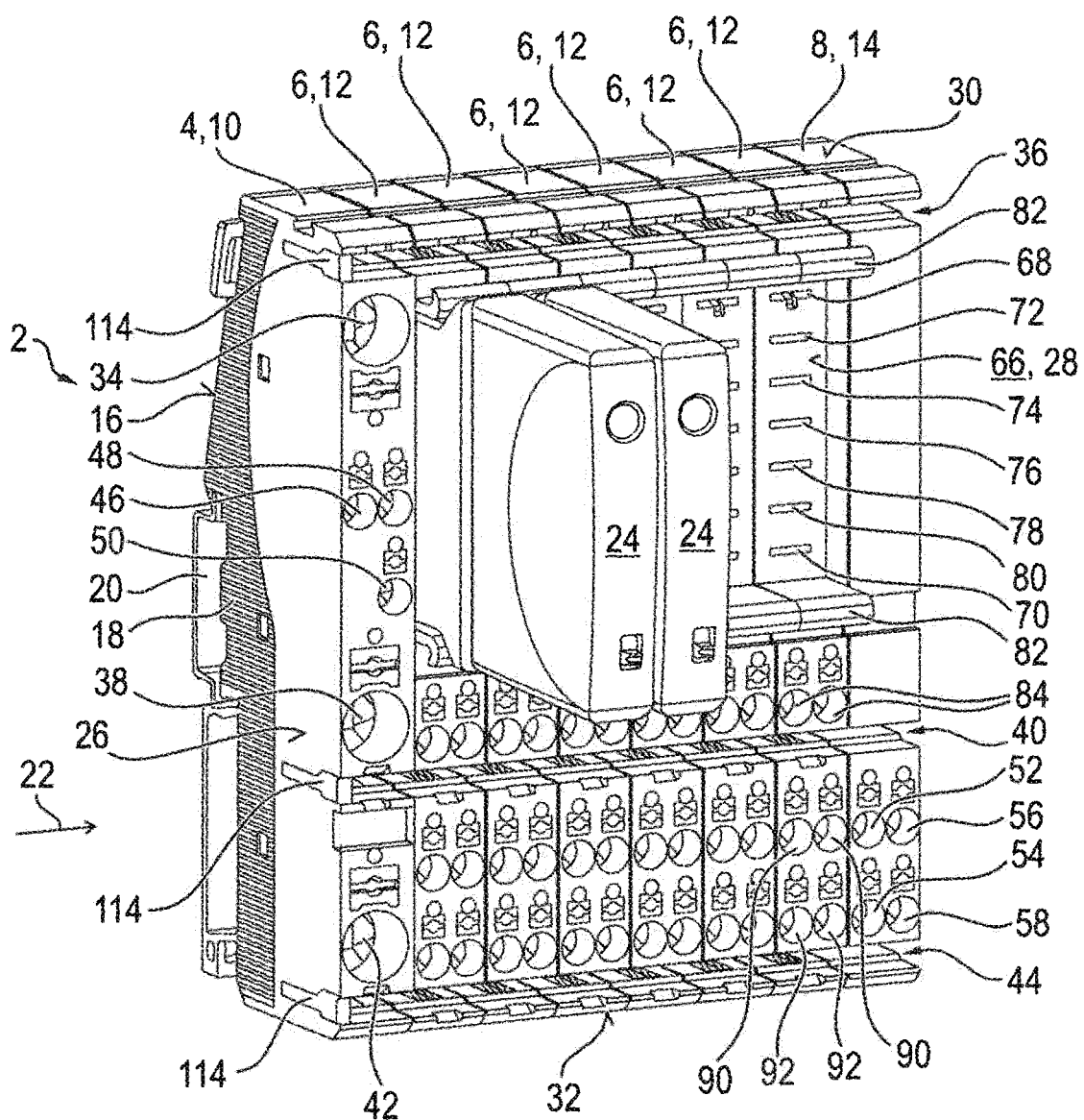
FIG. 1 is a perspective view of a power distributor with a supply module, with a signal module, with six intermediate connection modules, and with two equipped circuit breakers.
Figure 2:
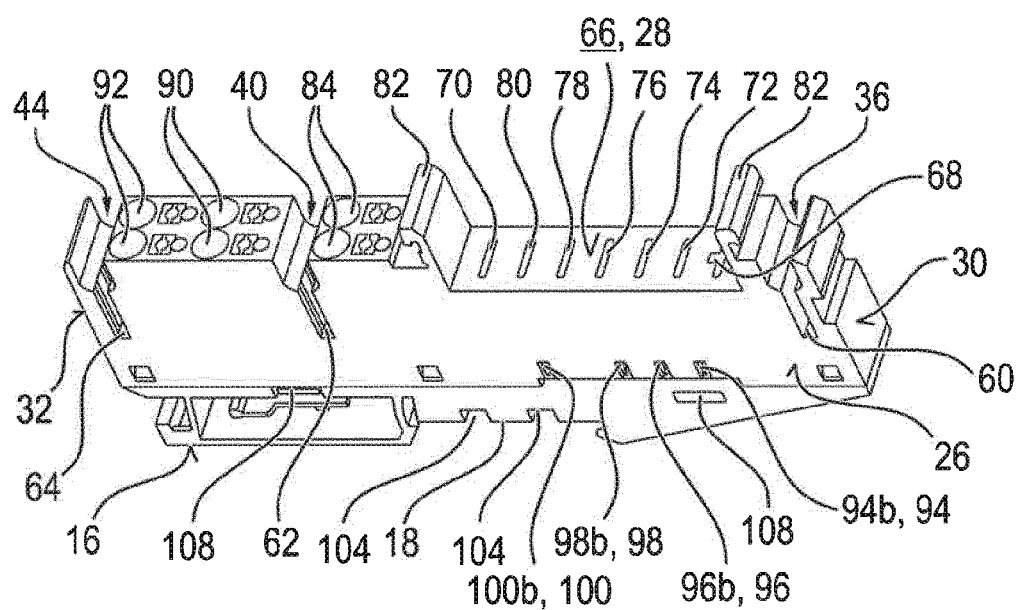
FIG. 2 is a perspective view of a connection module.

As (power distribution) modules, the power distributor 2 shown in FIG. 1 comprises a supply module 4, six connection modules 6 and a signal module 8, wherein the connection modules 6 are shown individually in FIG. 2. Each module 4, 6, 8 includes a housing 10, 12 or 14 that is separate, i.e., separated from the other modules 4, 6, 8. Each module 4, 6, 8 is designed in the form of a modular device and accordingly has a groove-like slot 18 on the rear panel of a housing 16, with which the respective module 4, 6, 8 can be snapped onto a supporting rail 20 for assembly.

The profile direction of this slot 18—and, accordingly, also the profile direction of the supporting rail 20 corresponding to this slot 18 in the assembled state—define a row direction 22 along which the modules 4, 6, 8 are lined up together. In the exemplary embodiment shown in FIG. 1, two circuit breakers 24 are arranged at a respective connection module 6, inside the (module) package formed of the modules 4, 6, 8, wherein the supply module 4 on the one hand and the signal module 8 on the other hand externally flank the connection modules 6 in the row direction 22 as side parts.

The housing surfaces of each module 4, 6, 8 situated opposite each other in the row direction 22 are referred to as the (housing) end face 26 of the respective module 4, 6, 8. The housing side of each module 4, 6, 8 situated opposite to the rear panel 16 is referred to as the (housing) front side 28 of the module 4, 6, 8. This front side 28 faces a user when the power distributor 2 is mounted in a switch cabinet. The two remaining housing sides of each module 4, 6, 8 are—according to the conventional assembly position of the module 4, 6, 8—referred to as the (housing) top 30 and the (housing) bottom 32, independent of the actual position in the surrounding space.

The supply module 4 comprises a supply terminal 34 for making electrical contact to a non-illustrated main circuit and thus for feeding an electric current into the power distributor 2. The supply terminal 34 is arranged on the front side 28 of the housing 10 near the top 30, and is configured as a connecting terminal for a wire or stranded conductor of the main circuit. Within the housing, the supply terminal 34 is coupled in an electrically conductive manner to a not-shown coupling contact which is disposed within a groove-like housing slot 36.

At approximately half the height of the housing 10, the supply module 4 has a ground connection 38 as a negative terminal (DC power) or as a neutral conductor (AC). Within the housing 10, the ground connection 38 is coupled in an electrically conductive manner with a lateral socket for a contact connection to the attached connection module 6, and to a coupling contact which is positioned in a housing slot 40 at the front side 28 inserted centrally at the housing 10.

The supply module 4 further comprises a return port 42 for making electrical contact to a non-illustrated current return as part of a protective or functional ground. The return port 42 is located near the bottom 32 at the front side 28 of the housing 10, and like the supply terminal 34 and the ground connection 38, is designed as a connecting terminal. The return port 42 is in turn electrically conductively connected to a coupling contact within a housing slot 44, which is arranged in the bottom 32 area.

The groove-like housing slots 36, 40, 44 are in particular inserted such into the housing 10 of the supply module 4 that they are open towards the front side 28. The housing slots 36, 40, 42 extend in the row direction 22 substantially over the entire housing width, and are thus open towards the two oppositely situated end faces 26 of the housing 10.

Between the supply terminal 34 and the ground connection 38, three connecting terminals are provided on the housing front side for a signal terminal 46, for a data bus 48 and for an address bus terminal 50. The terminals 46, 48, 50 are reduced in size as compared to the terminals 34, 38, 42, and are preferably designed as switching or communication signals for the feed-in of low currents. The terminals 46, 48, 50 are coupled similarly to the ground connection 38 within the housing 10, each with a lateral socket for contacting with the connection module 6.

The housing 14 of the signal module 8 comprises three housing slots 36, 40, 44, which are substantially designed identical to those of the supply module 4 but have no coupling contact connection with the housing interior. Between the lower housing slots 40 and 44, four terminals 52, 54, 56 and 58 are arranged as a ground connection 52, a signal terminal 54, a data bus terminal 56 and an address bus terminal 58.

The terminals 52, 54, 56, 58 are coupled within the housing 14 with contact elements as a coupling contact connection with the connection module 6. The flat plug-like contact elements at least partially project from the housing 14, out of the end face 26 which faces a connection module 6 in the assembled state.

With reference to FIGS. 2 to 6, the construction of a connection module 6 is explained in more detail below, wherein for example in FIG. 1, only one connection module 6 is provided with reference numerals. The housing 12 of the connection module 6 has three housing slots 36, 40 and 44, which are substantially configured identical to those of the supply module 4, each with a coupling contact 60, 62, 64 inside the housing. Between the housing slots 36 and 40, a front-side plug-in slot 66 is provided for the circuit breaker 24. The plug-in slot 66 has a first contact opening 68 for a first plug contact of the circuit breaker 24 (preferably designed as a flat plug), and a second contact opening 70 for a second plug contact of the circuit breaker 24 (preferably also formed as a flat plug).

The slot 66 is also provided with five other contact openings 72, 74, 76, 78 and 80 for corresponding signal or communication contacts (preferably designed as flat plugs)

of the circuit breaker. As can be seen in particular in FIGS. 3 through 6, the contact openings 68, 70, 72, 74, 76, 78, 80 of the slot 66 are in particular designed as plug base contacts. The contact openings or plug base contacts 68, 70, 72, 74, 76, 78, 80 and the corresponding plug contacts of the circuit breaker 24 are in particular designed complementary to each other in the sense of plug-socket pairs.

In the upper and lower regions, the slot 66 further includes in each case a hook-like holding element 82 for improved support of an equipped circuit breaker 24. Below the slot 66, two connecting terminals are arranged as load terminals 84 for connection of a consumer or load circuit. Inside the housing, the load terminals 84 are electrically conductively coupled to the contact opening 70 by means of a conductor rail 86. Further, by means of an electrically conductive rail 88, the contact opening 68 is coupled substantially in one piece inside the housing 12 to the coupling contact 60 of the housing slot 36. Thus, in the assembled state, the circuit breaker 24 is connected between the coupling contact 60 and the load terminals 84 for interruption of the load circuit.

The connection module 6 further comprises four connecting terminals 90, 92, which are arranged between the lower housing slots 40, 44 as two ground connections 92 and two return ports 90. Inside the housing 12, the ground connections 92 are electrically conductively connected at in each case one coupling contact 64 of the housing slot 44, and the return ports 90 are each electrically conductively connected to a coupling contact 62 of the housing slot 40.

The plug socket contacts 70, 72, 74, 76, 78 are electrically conductively coupled inside the housing to four coupling contacts 94, 96, 98 and 100. The coupling contacts 94, 96, 98, 100 are designed in particular as plug-socket pairs, wherein the plugs hereinafter have the reference numeral—a and the sockets have the reference numeral—b. The sockets 94b, 96b, 98b, 100b are arranged in end-face housing openings, wherein the plugs 94a, 96a, 98a, 100a at least partially—as shown particularly in FIG. 3—project from the opposite end face 26 of the housing 12.

Figure 3:
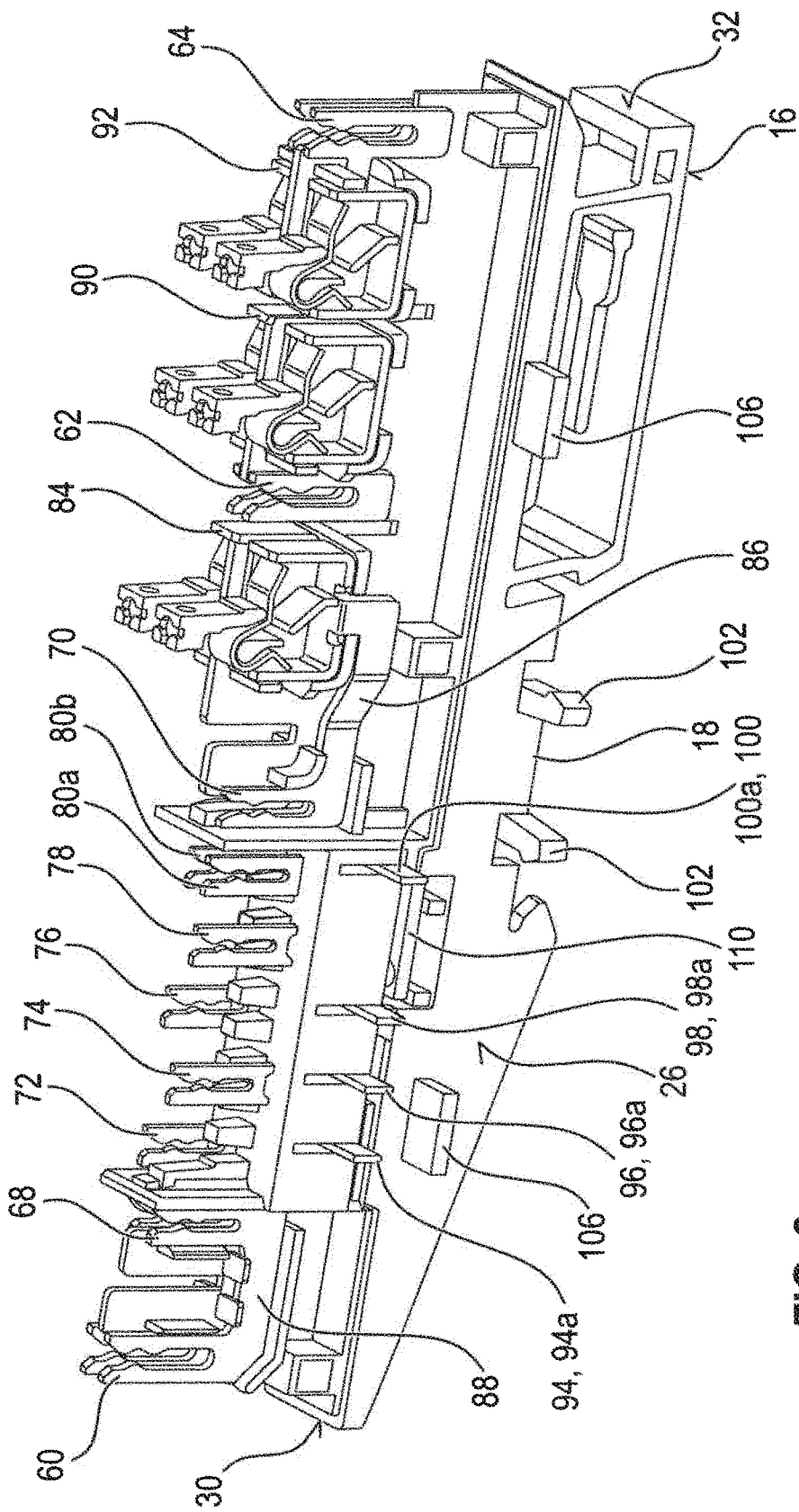
FIG. 3 is a perspective view of a connection module without a housing.
Figure 4:
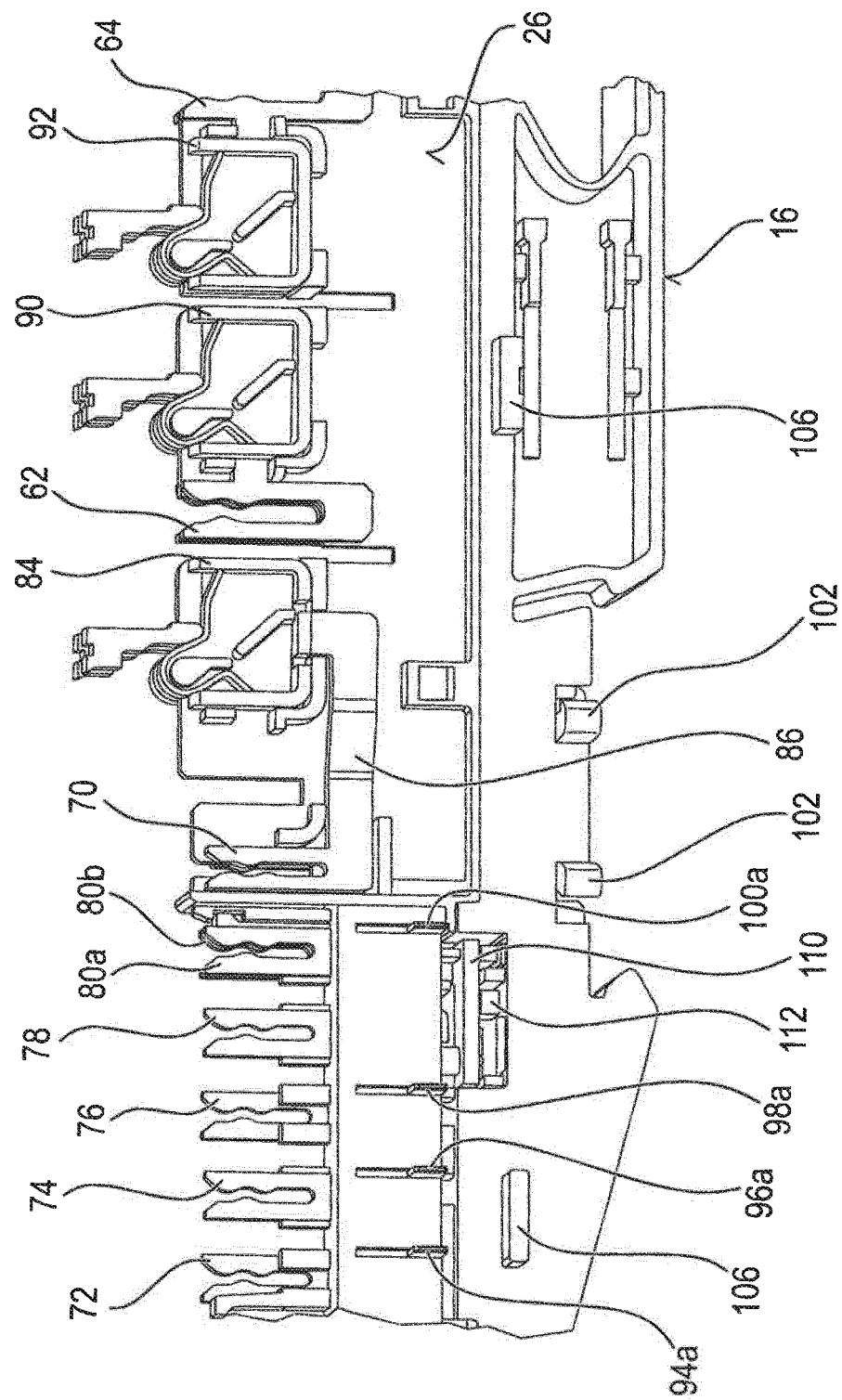
FIG. 4 is a side view of the connection module without a housing.

On the rear panel 16 in the area of the slot 18, the housings 12 of the connection modules 6 have—as shown clearly in FIGS. 3 and 4—two detent tongues 102 which project laterally from the respective end face 26. The detent tongues 102 can be latched or snap-fitted with corresponding detent slots 104 for the purpose of facilitated assembly of the modules 4, 6, 8, wherein the detent slots 104 are conveniently disposed on the opposite end face 26 of the detent tongues 102. On the detent-tongue side end face 26, the housings 12 further have two integrally formed joining projections 106 which project beyond the end face 26 to facilitate stringing or plugging the modules 4, 6, 8 together. In the assembled state, the joining projections 106 engage at least partially in corresponding joining slots 108 of the adjacent modules 4, 6 for the purposes of vibration-proof and reliable fastening.

Figure 5:
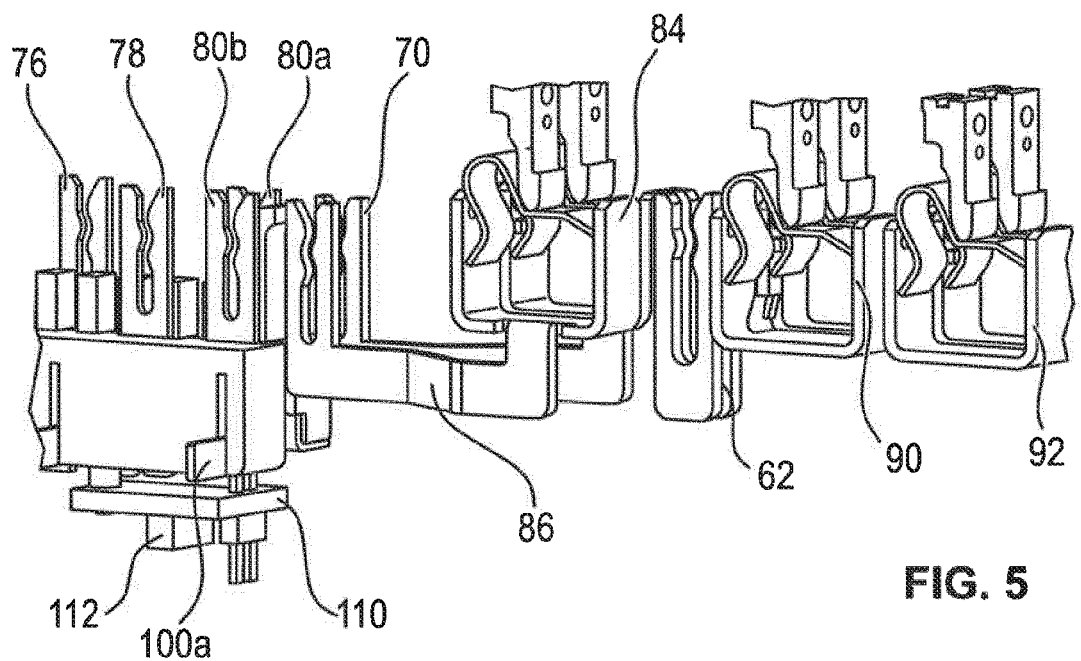
FIG. 5 is a perspective view of a plurality of contact elements of the connection module
Figure 6:
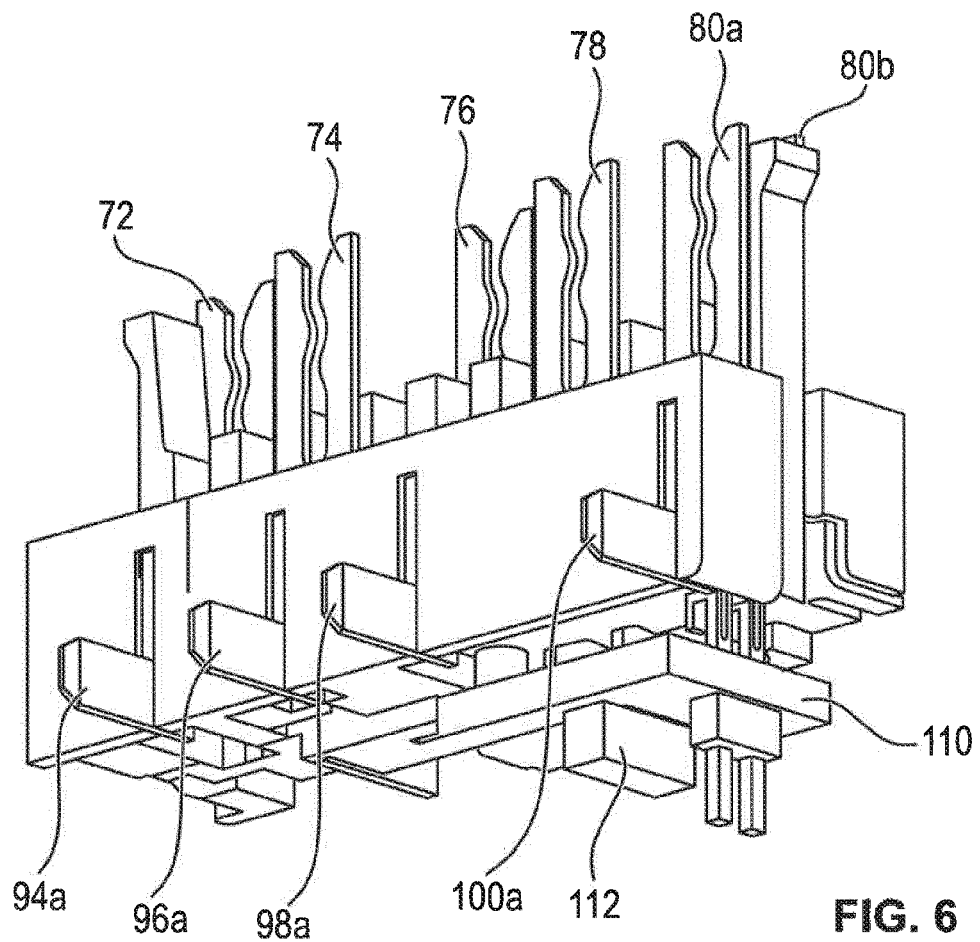
FIG. 6 is a perspective view with a view of a rear panel of the contact elements with an intermediate base resistor.

As shown in particular in FIGS. 3, 5 and 6, the plug socket-like contact opening 80 is designed in particular as a split plug base contact. The partial plug base contacts 80a, 80b thus formed are coupled by means of a circuit board 110 which is arranged on the rear panel of the contact openings 68, 70, 72, 74, 76, 78, 80. Between the partial plug base contacts 80a, 80b, a base resistor 112 is connected to the circuit board 110. The base resistor 112 is connected in series between the coupling contacts 100a and 100b, and the circuit board 110 is connected to the coupling contacts 98a, 98b.

For assembly of the power distributor 2, according to FIG. 1, a supply module 4 is lined up face side with a number of connection modules 6 that correspond to a number of load circuits to be connected, and a signal module 8. By means of detent tongues 102, the modules 6, 8 are thereby connected (plugged in) in alignment and releasably to each other at the end faces 26 of each housing 12, 14 with corresponding detent slots 104 of the modules 4, 6 on the end face of the respective adjacent module 4, 6, 8. The end faces 26 of the connection modules 6 are thus substantially completely covered by the supply module 4, by adjacent connection modules 6 as well as by the signal module 8. As shown particularly in FIG. 1, the housing slots 36, 40 and 44 of the adjacent modules 4, 6, 8 align with each other, so that in each case a substantially continuous and rectilinear groove-like interspersion of the modules 4, 6, 8 is realized.

In the context of such a power distributor 2, the supply terminal 34 of the supply module 4 is connected in parallel with the lined-up modules 6 by a non-shown conductor rail being pressed into the aligned housing slots 36, and thus being contacted with the corresponding coupling contacts 60. The conductor rail is in this case dimensioned in length such that it extends over the entire width of all the modules 4, 6, 8 that are to be integrated in the power distributor 2. The connection of the modules 4, 6 thus connected in parallel to an external power source takes place here by means of conventional wiring of the main circuit to the connection terminal of the supply terminal 34.

Likewise, the ground connections 38, 52, 90 and the return ports 42, 92 of the attached modules 4, 6 are connected in parallel to one another by pressing in each case a further conductor rail into the housing slots 40 and 44, wherein the ground connection 38 is connected in particular with a negative conductor or neutral conductor, and the return port 42 is connected in particular with a protective or functional ground as the return potential. The individual load circuits of the power distributor 2 are then connected to in each case an associated connection module 6 by the respective supply lines of the load circuit being electrically conductively connected to the load terminals 84 of the connection modules 6, and by the return line of the load circuit being electrically conductively connected to the terminals of the return terminals 90 of the connection modules 6.

In order to close off the housing slots 36, 40, 44 of the modules 4, 8 in a shockproof manner towards the respective end faces 26 that are situated on the outside as viewed in the row direction 22, each housing slot 36, 40, 44—as shown in FIG. 1 for the supply module 4—is provided on the outside with an insulating cover element 114.

For operating the power distributor 2, an external controller 116 is provided as a control unit, which is connected to the supply module 4 with the data bus terminal 48 and the address bus terminal 50. Preferably, the circuit breakers 24 each have a breaker-internal controller 118, which is connected to the controller 116 in the assembled state for signaling. The wiring of the controllers 116, 118 as part of a bus functionality is shown schematically and in simplified form in FIG. 7.

Figure 7:
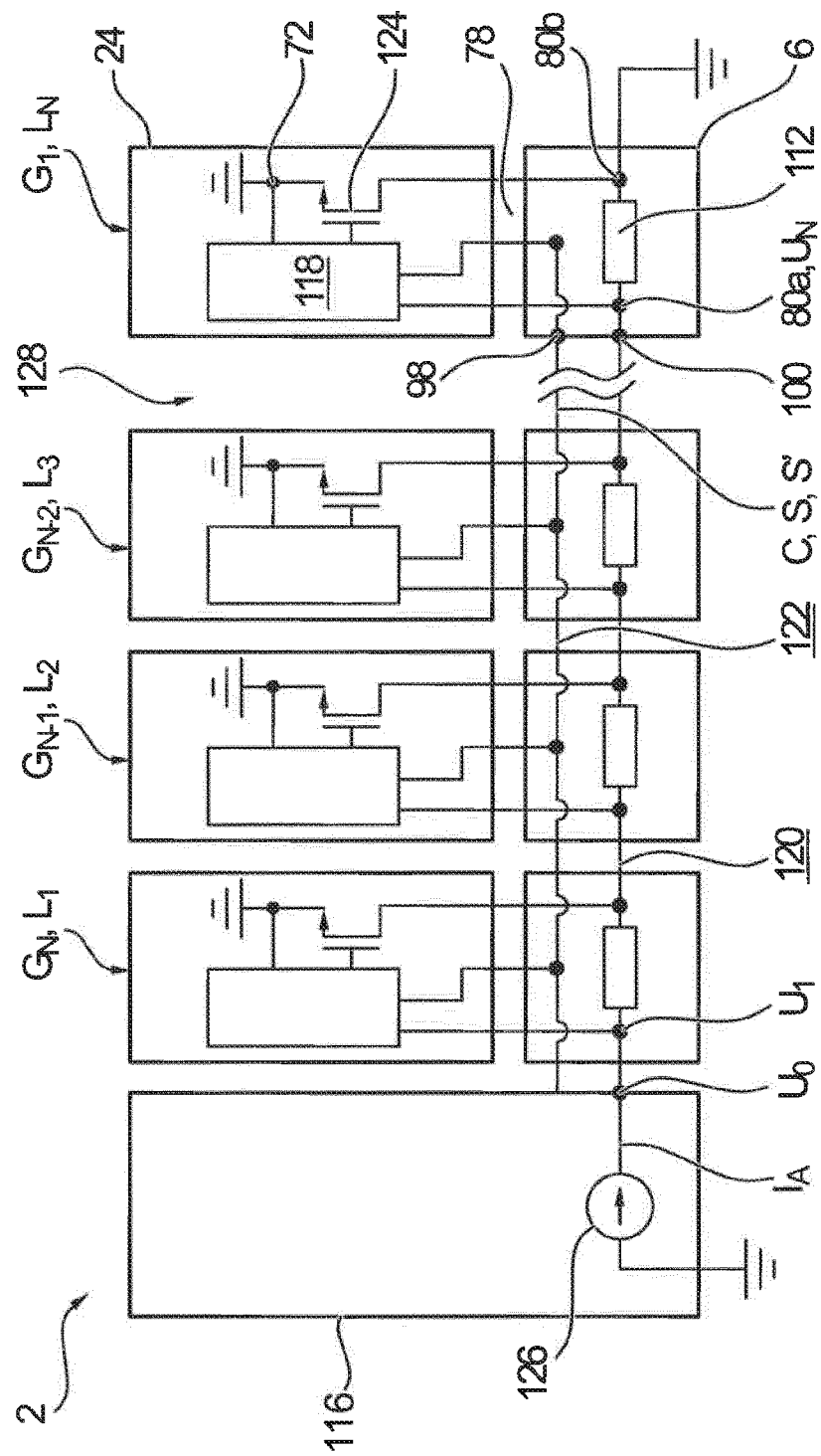
FIG. 7 is a schematic circuit of the power distributor with a controller and N connection modules connected thereto, each having an equipped circuit breaker.

FIG. 7 shows a general power distributor 2 with N aligned connection modules 6, wherein the supply module 4 and the signal module 8 of the power distributor 2 are not shown for reasons of simplicity. The N connection modules 6 are each equipped in the illustrated embodiment with a circuit breaker 24 comprising the controller 118. As can be comparatively clearly seen in FIG. 7, the base resistors 112 of the attached connection modules 6 are connected in series by means of the coupling contacts 100, and form a substantially continuous resistor chain 120 between the address bus terminals 50 and 58.

The split plug contact of the circuit breaker 24 contacts the plug base contact 80 in such a way that the controller 118 of the circuit breaker 24 is connected substantially in parallel to the base resistor 112 via the partial plug base contacts 80a, 80b. Via the contact opening 76, the controller 118 is connected to a data bus line or communication line 122 formed by the coupling contacts 98. The partial plug base contact 80b is breaker-internally interconnected with the plug base contact 72, wherein the plug base contact 72 is electrically conductively coupled via the coupling contacts 94 in particular to the ground connection 38 of the supply module 4. Between the plug base contacts 80b, 72, a transistor controlled by the controller 118 is connected as a switching element 124 in the circuit breaker 24. By way of example in FIG. 7, only the N-th connection module 6 with the circuit breaker 24 is provided with reference numerals.

The controller 116 internally comprises a DC power source 126 for supplying the resistor chain 120 with an addressing current $I_A$. During operation, therefore, the addressing current $I_A$ flows through the resistor chain 120 so that at all base resistors, a respective voltage $U_i$ is dropped, wherein the running index i is selected from 1 to N. The controller 116 is adapted and arranged to determine the number N of the connected connection modules 6 on the basis of a number value A. To this end, the controller 116 records an output voltage $U_O$ of the DC power source 126. In a known addressing current $I_A$ and the known value of the electrical resistance of a single base resistor 112, the number value A is obtained in a simple manner from the quotient of the output voltage $U_O$ and the voltage drop across a single base resistor 112.

When in use, each controller 118 records the module-specific voltage value $U_i$ via the partial plug base contact 80a, wherein with increasing length of the resistor chain 120 between two connection modules 6, the voltage value $U_i$ is always reduced by a voltage drop at the respective base resistor 112. The controllers 118 transmit a controller signal C, which corresponds to the respective voltage $U_i$, to the controller 116 via the data bus line 122.

The controller 116 assigns a device address $G_i$ to each connected controller 118 based on the received controller signals C. The respective device address $G_i$ results, for example, in a simple manner from the integer rounded quotient of the respective, recorded voltage $U_i$ and the voltage dropped across a single base resistor 112. As a result, each circuit breaker 24 and each controller 118 is assigned a (physical) device address $G_i$, which decreases starting from the DC power source 126 along the resistor chain 120. At the N-th connection module 6 at the end of the resistor chain 120, the voltage $U_N$ is equal to the voltage dropped across the base resistor 112, i.e., the N-th connection module 6 is assigned the first device address $G_1$. Accordingly, the first connection module 6 of the resistor chain 120 receives the N-th device address $G_N$ since the recorded voltage $U_1$ is substantially equal to the output voltage $U_O$ of the DC power source 126. The device address $G_N$ is transmitted from the controller 116 to the respective controllers 118 and is stored in an associated data memory of the controller 118.

For the purpose of improved operability, the controller 116 is adapted and arranged to perform a mapping process that converts the set of device addresses $G_i$ into a set of logical addresses $L_i$ which correspond to the order of the lined-up connection modules 6. The logical addresses $L_i$ are essentially inverted in their order in relation to the device addresses, that is, the controller 118 of the first connection module 6 in the resistor chain 120 has the first logical address $L_1$, the subsequent controller 118 has the second logical address $L_2$, etc., and the last controller 8 of the connection module 6 arranged at the end of the resistor chain 120 has the N-th logical address $L_N$. Thus, the use of the power distributor 2 is made more intuitive for a user.

The controller 116 is preferably adapted and arranged to automatically start a failure diagnosis in the event of failure. In this context, in particular, a failure is understood to be a galvanic interruption 128 of the resistor chain 120, which is indicated in FIG. 7 only by way of example between the third connection module 6 and the N-th connection module 6.

Figure 8:
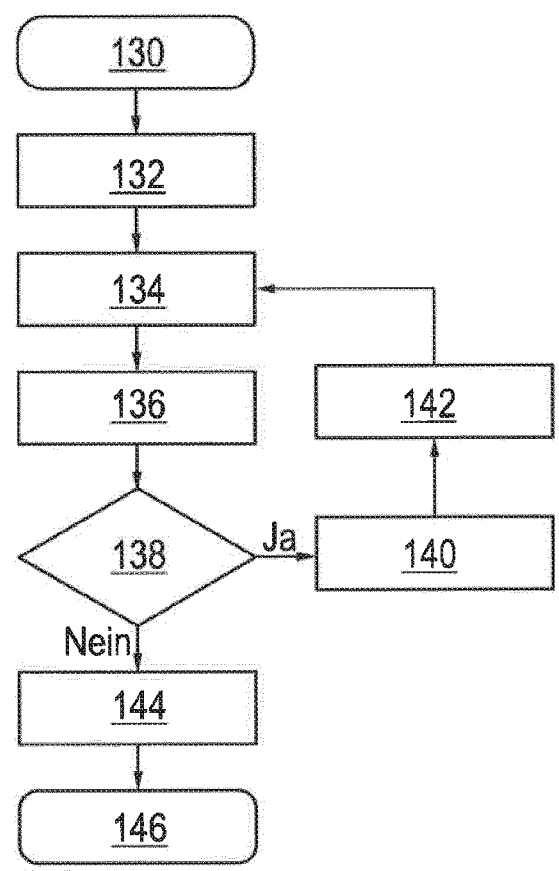
FIG. 8 is a flowchart for a search process of the first controller during failure diagnosis.

The process of the failure diagnosis is explained hereinafter with reference to the flowchart shown in FIG. 8.

In the event of an interruption 128, the current flow of the addressing current $I_A$ is interrupted by the resistor chain 120. The controller 116 then initiates a search process in a first method step 130. At the beginning of such a search process, a power-on process 132 is first initiated. In the power-on process 132, the controller 116 transmits a switching signal S to all connected controllers 118 by means of the data bus line 122. Upon reception of the switching signal S, the respective controller 116 closes the respectively associated switching element 124 so that the resistor chain 120 is connected to ground in each case via the plug base partial contact 80b and the plug base contact 72. This way, an addressing current $I_A$ flows through the resistor chain 120 to ground.

After the power-on process 132, the number of attached connection modules 6 is detected by the controller 116 by determining the number value A in a detection process 134. In a subsequent addressing process 136, the device addresses $G_i$ are allocated and transmitted from the controller 116 to the connected controllers 118. Next, during a query 138, the respective device addresses $G_i$ are sent from the controllers 118 as controller signals C to the controller 116, wherein the controller 116 checks whether the first device address $G_1$ is present.

If a controller 116 with the device address $G_1$ is detected, a shutdown process 140 of the controller 116 is started, in which the controller 116 transmits a switching signal S' to the controller 118 with the device address $G_1$. Upon receipt of the switching signal S', the controller 118 switches off its associated switching element 124 so that the respective base resistor 112 at the partial plug base contact 80b is no longer connected to ground. This way, the respective base resistor 112 is removed from the interconnection of the resistor chain, and the addressing current $I_A$ flows to ground through the base resistor 112 that is connected in the row upstream thereof. Subsequently, in a deletion process 142, the respective controller 118 clears the first device address $G_1$ stored in the (data) memory and a new detection process 132 of the controller 116 is started.

The method steps of the search process composed of detection process 134, addressing process 136, query 138, shutdown process 140 and deletion process 142 are repeated until the controllers 118 no longer report a first device address $G_1$ to the controller 116. After that, the search process is completed with a final process 144. The controller 116 reports in a result process 146 that the interruption 128 is located between the controller 116 that was detected last and the no longer detected connection module 6.

In a suitable dimensioning, the base resistors 112, for example, all have a resistance value of 1 kΩ so that in a generated addressing current $I_A$ of preferably 1 mA, a voltage $U_i$ of 1 V is dropped at each base resistor 112.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A power distributor comprising:
   a first controller; and
   at least two connection modules connected to the first controller and being adapted to be mounted on a supporting rail;
   wherein the at least two connection modules are attachable to each other and each comprise coupling contacts for an electrical and/or signaling contact connection,
   wherein inside each of the at least two connection modules, a base resistor is provided between two of the coupling contacts and wherein the at least two connection modules are lined up, such that the base resistor of each of the at least two connection modules are connected together to form a series-connected resistor chain,
   wherein the at least two connection modules are each equipped with an actuatable circuit breaker,
   wherein the circuit breaker of each of the at least two connection modules each have a breaker-internal second controller for recording a voltage dropped at the respective, associated base resistor and a switching element that is actuated by the second controller, the switching element being connected between the respective, associated base resistor and a ground connection of the respective, associated connection module,
   wherein the second controllers are configured to transmit a controller signal to the first controller on the basis of the recorded voltage, the controller signal corresponding to the voltage dropped at the respective, associated base resistor, and wherein the first controller is configured to determine a total resistance value of the resistor chain,
   wherein the first controller includes a DC power source for supply of the resistor chain,
   wherein the first controller is configured to determine, based on the total resistance value, a number value corresponding to a number of the at least two connection modules that are attached, and
   wherein, in the event of a galvanic interruption of the resistor chain, the first controller and the second controller of each of the at least two connection modules are configured to initiate a search process for determining the point of interruption.

2. The power distributor according to claim 1, wherein, for guiding the controller signals, a communication line is provided which is formed by the coupling contacts.

3. The power distributor according to claim 1, wherein each of the at least two connection modulo modules has a contact opening with a split plug base contact for a plug contact of the circuit breaker, the split plug base contact formed of two partial plug base contacts and wherein the base resistor is connected between the two partial plug base contacts.

4. The power distributor according to claim 3, wherein the ground of each of the at least two connection modules is in contact with the respective second controller, is in contact with one of the two partial plug base contacts of the plug contact, and wherein the switching element, actuatable by the second controller, is connected between the ground connection and the one of the two partial plug base contacts.

5. A method of operating a power distributor having a first controller and having at least two attached connection modules, each of the at least two connection modules having one base resistor therein, with the base resistor of each of the at least two connection modules being connected together to form a series-connected resistor chain, the method comprising:
   providing each of the at least two connection modules with an actuatable circuit breaker with a breaker-internal second controller and a switching element, the second controller transmitting a controller signal, which corresponds to the voltage dropped at the respective base resistor, to the first controller, at which a total resistance value of the resistor chain is determined; and
   determining, by the first controller and based on the total resistance value, a number value corresponding to a number of the at least two connection modules that are attached,
   wherein, in the event of a galvanic interruption of the resistor chain, a search process for determining the point of interruption is initiated.

6. The method according to claim 5, wherein, in response to the controller signals of the second controllers, module-specific device addresses are transmitted to the second controllers.

7. Method according to claim 6, wherein, as a function of the number value, the module-specific device addresses are converted to a set of logical addresses corresponding to an order of the at least two connection modules that are attached.

8. The method according to claim 5, wherein, at the beginning of the search process, all connected second controllers are set to an ON state, in which the respective switching element is closed.

9. The method according to claim 8, wherein, during the search process, the number value for the number of the at least two connection modules that are attached is determined, the module-specific device addresses are distributed to the second controllers, and the second controller with a first device address is switched off.

10. The method according to claim 9, wherein the search process is terminated when there is no second controller with the first device address.

* * * * *